(12) United States Patent
Angelopoulos et al.

(10) Patent No.: US 7,361,444 B1
(45) Date of Patent: Apr. 22, 2008

(54) MULTILAYERED RESIST SYSTEMS USING TUNED POLYMER FILMS AS UNDERLAYERS AND METHODS OF FABRICATION THEREOF

(75) Inventors: Marie Angelopoulos, Cortlandt Manor, NY (US); Katherina E. Babich, Chappaqua, NY (US); Douglas Charles LaTulipe, Danbury, CT (US); Qinghuang Lin, Mohegan Lake, NY (US); David R. Medeiros, Dobbs Ferry, NY (US); Wayne Martin Moreau, Wappingers Falls, NY (US); Karen E. Petrillo, Mahopac, NY (US); John P. Simons, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 769 days.

(21) Appl. No.: 09/256,034

(22) Filed: Feb. 23, 1999

Related U.S. Application Data

(60) Provisional application No. 60/075,567, filed on Feb. 23, 1998.

(51) Int. Cl.
*G03F 7/023* (2006.01)
(52) U.S. Cl. ............ 430/166; 430/169; 430/190; 430/270.1; 430/325; 430/326; 430/512; 430/514; 430/944
(58) Field of Classification Search ............ 430/270.1, 430/166, 169, 326, 944, 330, 512, 514
See application file for complete search history.

(56) References Cited

U.S. PATENT DOCUMENTS

| 4,571,374 | A | * | 2/1986 | Vikesland ............ 430/156 |
|---|---|---|---|---|
| 4,702,992 | A | * | 10/1987 | Ishii et al. ............ 430/272.1 |
| 5,385,804 | A | * | 1/1995 | Premlatha et al. .......... 430/195 |
| 5,886,102 | A | * | 3/1999 | Sinta et al. ................ 525/154 |
| 5,939,236 | A | * | 8/1999 | Pavelchek et al. ........ 430/273.1 |
| 5,981,145 | A | * | 11/1999 | Ding et al. .............. 430/271.1 |
| 5,985,524 | A | * | 11/1999 | Allen et al. ................. 430/326 |
| 5,994,430 | A | * | 11/1999 | Ding et al. ................... 524/80 |
| 6,136,498 | A | * | 10/2000 | Jagannathan et al. .... 430/270.1 |
| 6,190,839 | B1 | * | 2/2001 | Pavelchek et al. .......... 430/325 |

* cited by examiner

*Primary Examiner*—John S. Chu
(74) *Attorney, Agent, or Firm*—Thomas A. Berk; Daniel P. Morris

(57) ABSTRACT

Disclosed are multilayered resist structures including bilayer and top surface imaging which utilize tuned underlayers functioning as ARCs, planarizing layers, and etch resistant hard masks whose properties such as optical, chemical and physical properties are tailored to give a multilayer resist structure exhibiting high resolution, residue free lithography and methods of preparing these materials. These underlayer films include the group consisting of novolac based resists whose processing conditions are controlled, polyarylsulfones such as the BARL material, polyhydroxystyrene based derivatives, an example being a copolymer of polyhydroxystyrene and polyhydroxystyrene reacted with anthracenemethanol that contains a cross-linker, and acid catalyst (thermal acid generator), polyimides, polyethers in particular polyarylene ethers, polyarylenesulfides, polycarbonates such as polyarylenecarbonates, epoxies, epoxyacrylates, polyarylenes such as polyphenylenes, polyarylenevinylenes such as polyphenylenevinylenes, polyvinylcarbazole, cyclicolefins, and polyesters. Such films have index of refraction and extinction coefficient tunable from about 1.4 to about 2.1 and from about 0.1 to about 0.6 at UV and DUV wavelengths, in particular 365, 248, 193 and 157 nm and EUV. Moreover, underlayer films produced in the present invention do not interact with the resist limiting interfacial mixing and contamination of resist by an outgassing product. The bilayer and TSI resist structures can be used for 248, 193, 157, EUV, x-ray, e-beam, and ion beam technology.

6 Claims, 14 Drawing Sheets

(a) Swing curve of SLR on BARC, (b) Swing curve of bilayer resist

Bi-layer resist scheme
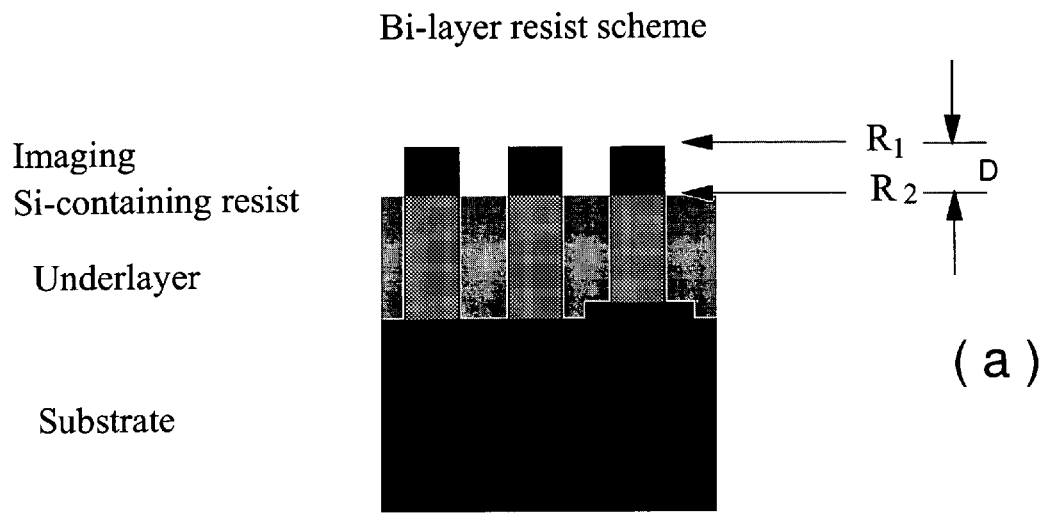
(a)
Top surface imaging (silylation reaction) scheme
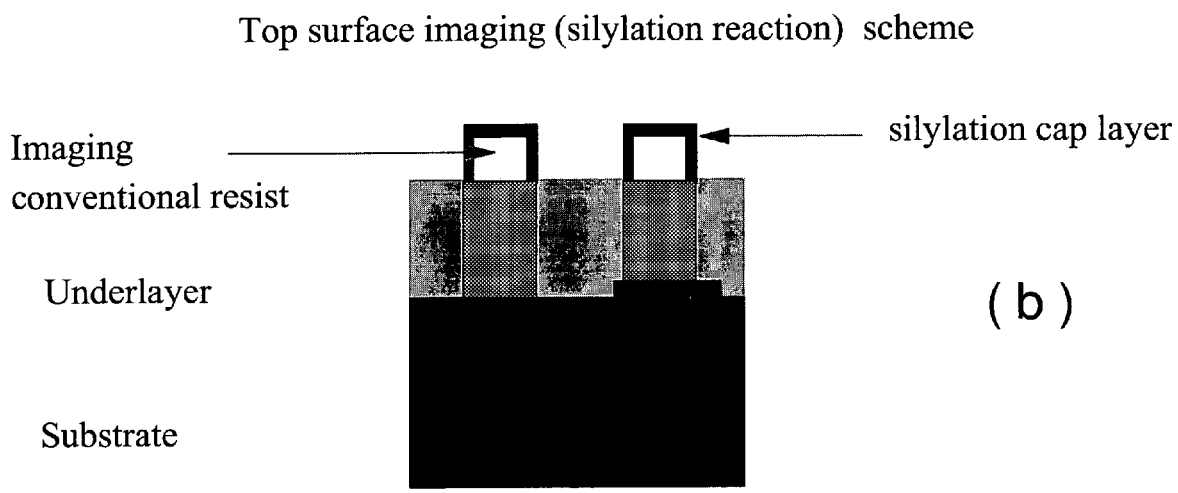
(b)
$$S \cong 4\sqrt{R_1 R_2} \cdot e^{-\alpha D} \quad (c)$$
$R_1$ - Reflectivity at top resist/air interface at 248nm
$R_2$ - Reflectivity at underlayer/top resist interface at 248nm
Fig. 2

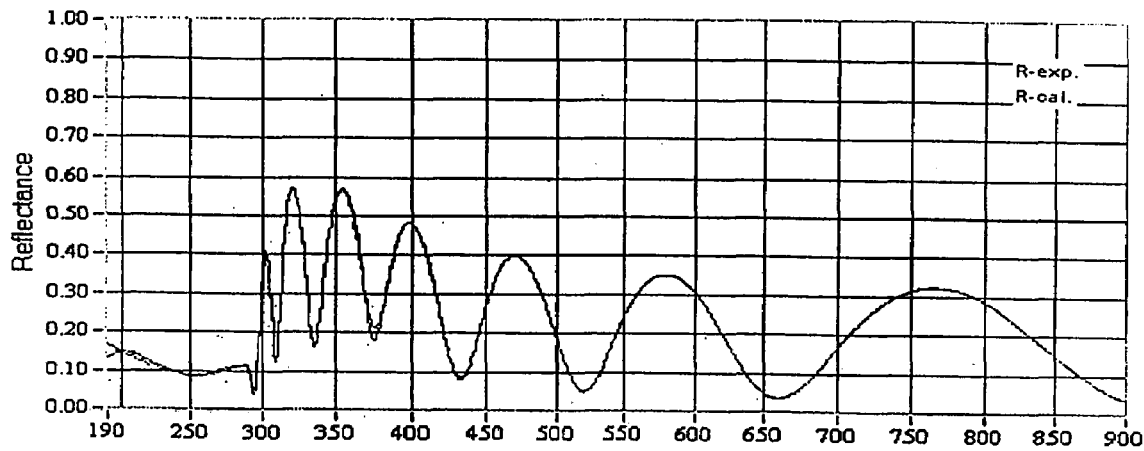
FIG 6 top
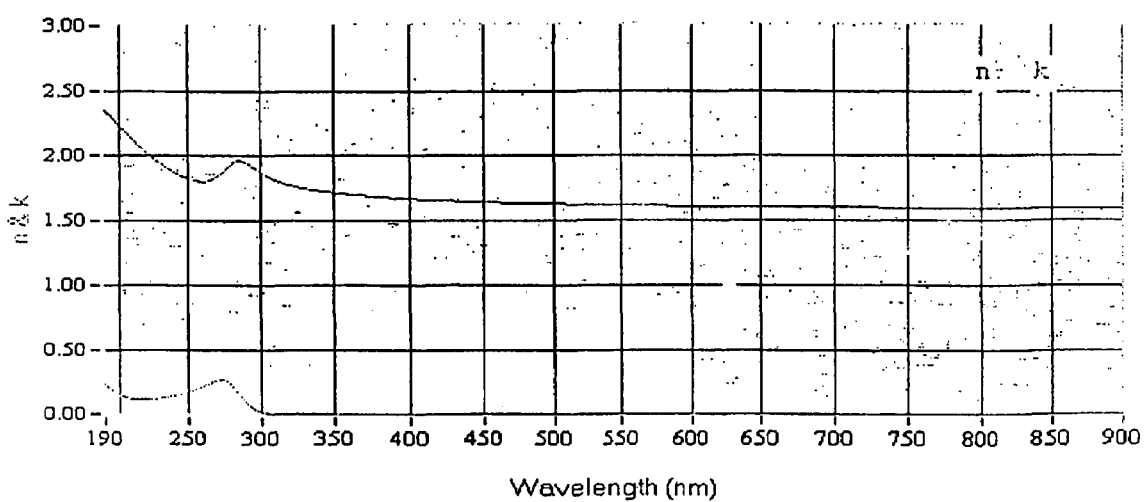
Wavelength (nm)
FIG 6 bottom

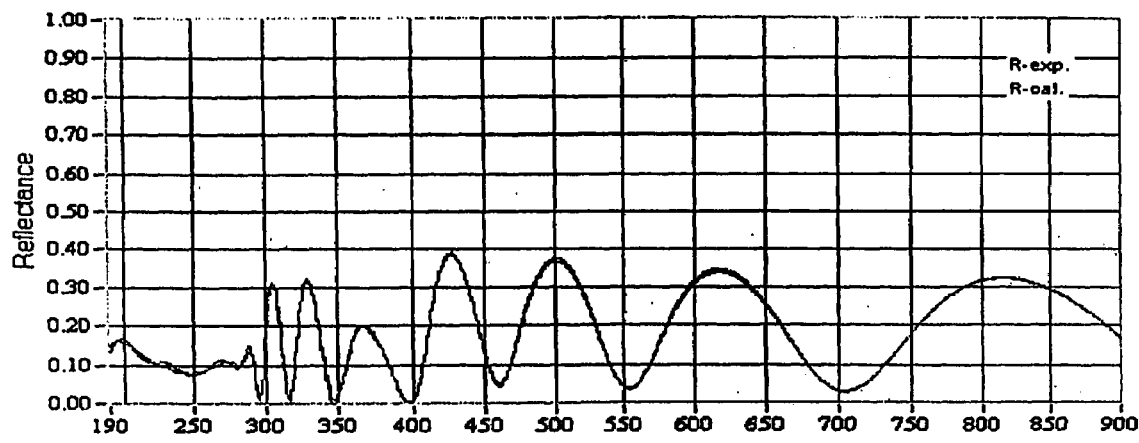
FIG 7 top
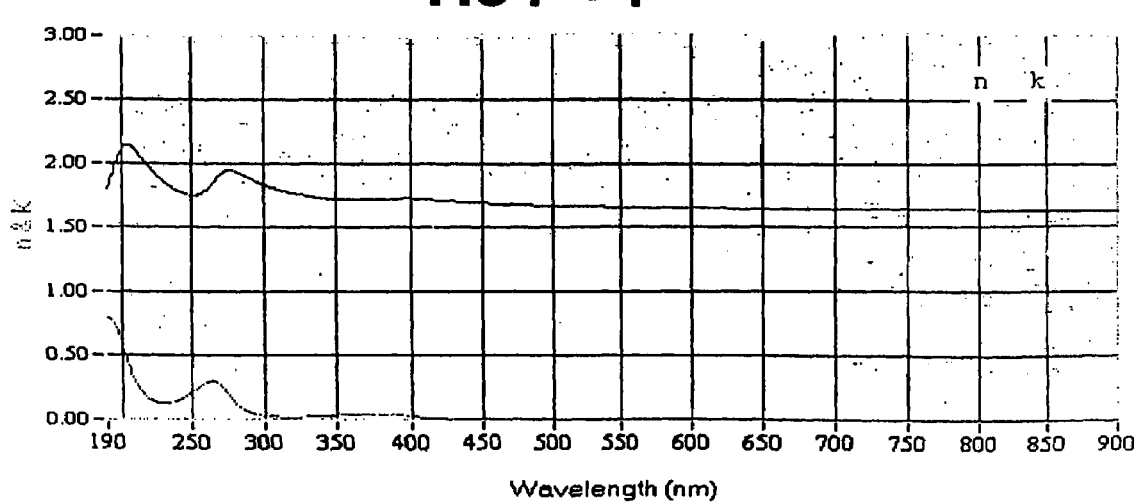
Wavelength (nm)
FIG 7 bottom

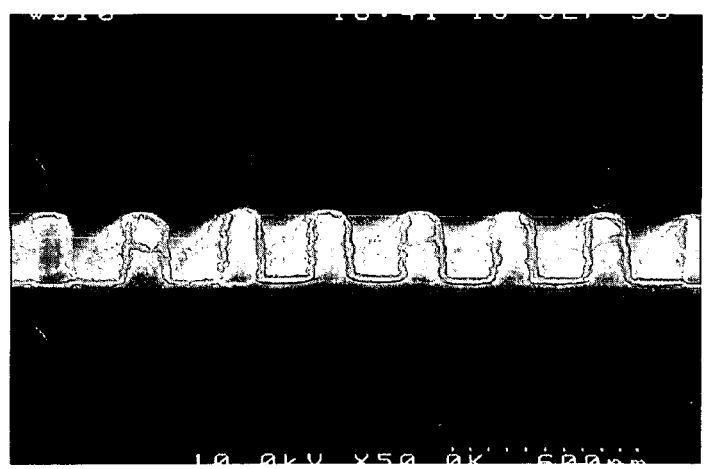
novolak underlayer with k=0.20 at 248nm
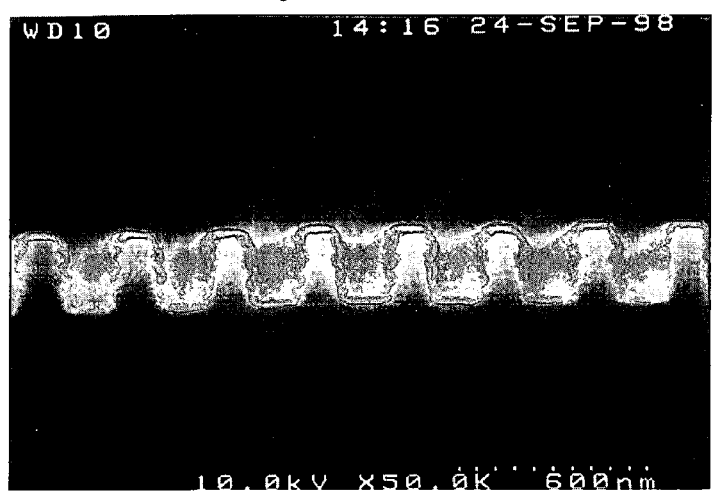
novolak underlayer with k=0.35 at 248nm
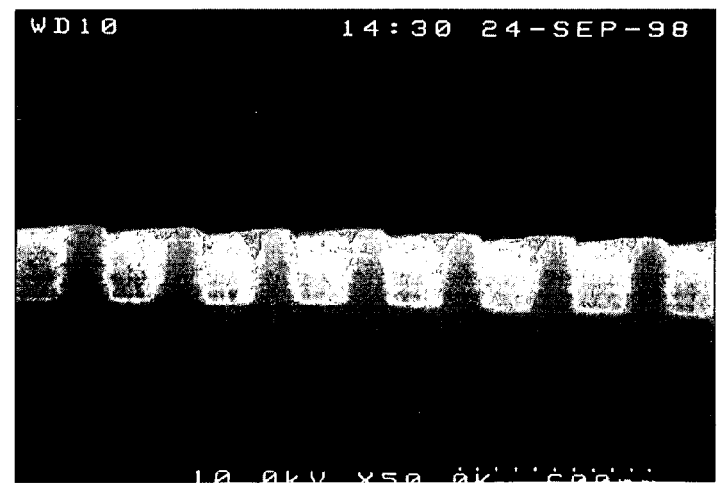
novolak underlayer with k=0.08 at 248nm
Fig. 8

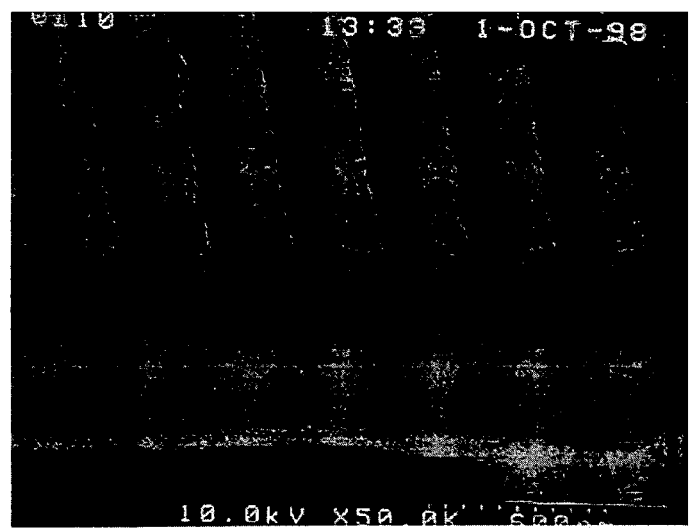
(a)
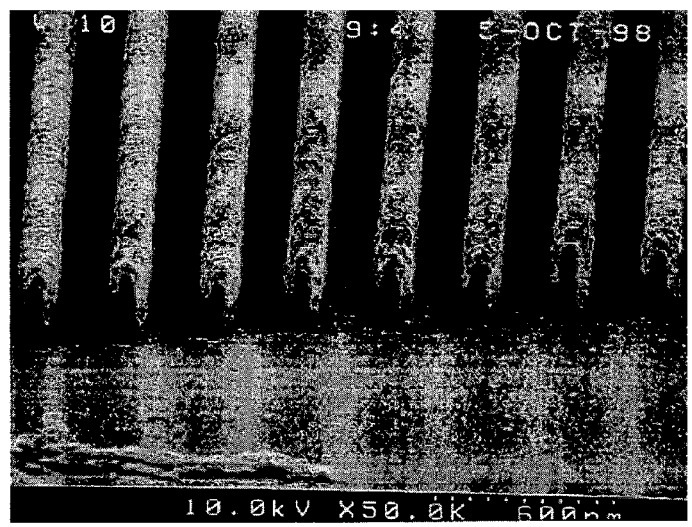
(b)
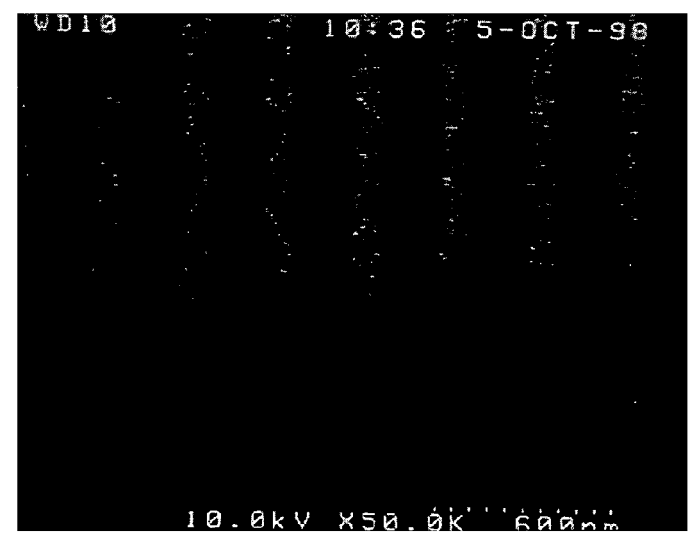
(c)
Fig. 9

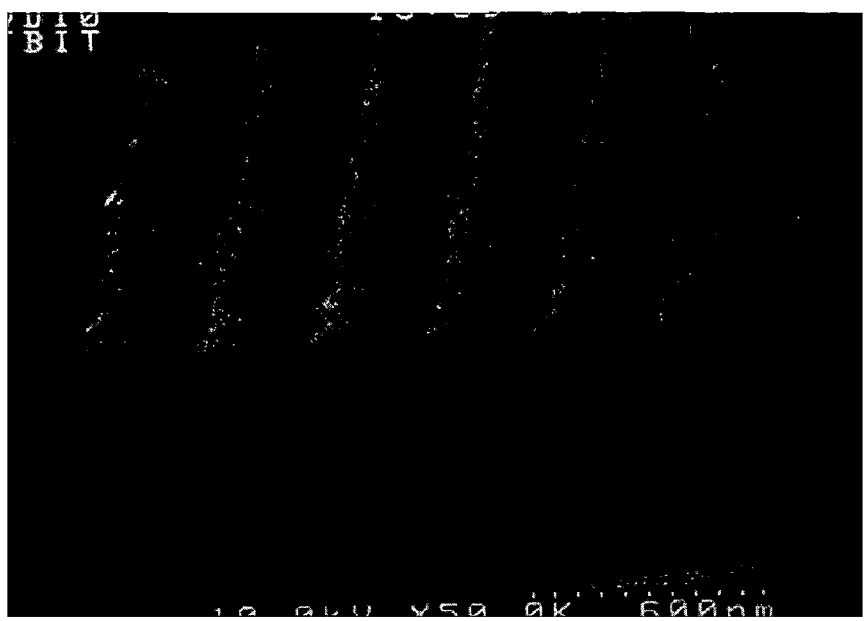
(a)
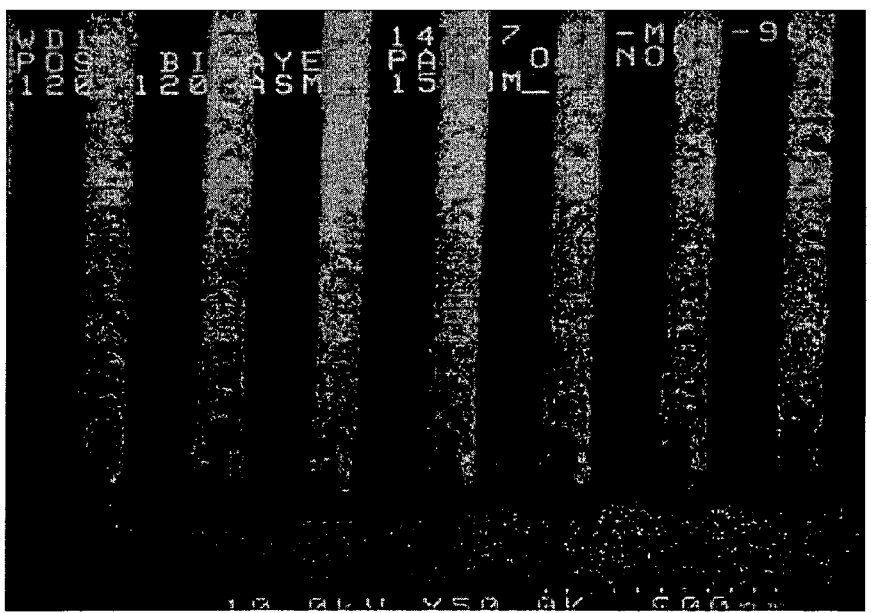
(b)
Fig. 10

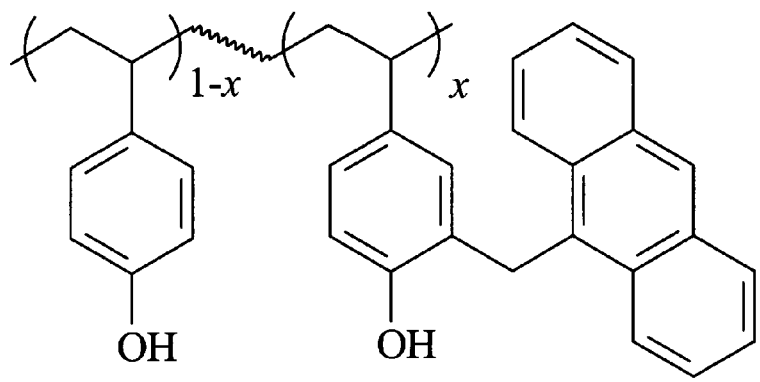
(a)
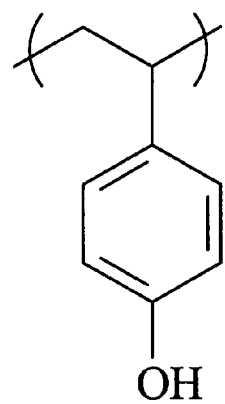
(b)
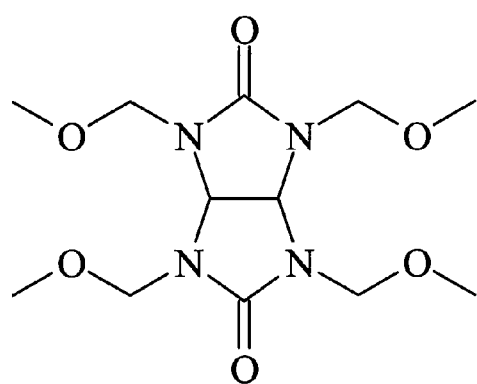
(c)
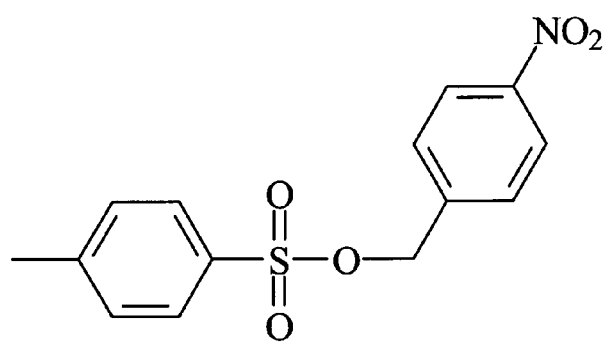
(d)
Fig. 12

MULTILAYERED RESIST SYSTEMS USING TUNED POLYMER FILMS AS UNDERLAYERS AND METHODS OF FABRICATION THEREOF This application claims priority from Provisional Application Ser. No. 60/075,567 which was filed on Feb. 23, 1998.

FIELD OF THE INVENTION

The present invention is directed to structures useful for fabricating integrated circuits (IC), in particular structures having a plurality of layers. More particularly, the present invention is directed to multilayer resist structures having underlayers whose properties such as optical, chemical and physical properties are tailored to give a multilayer resist structure exhibiting high performance and high resolution. Such a multilayer resist structure can be used for optical, electron beam, x-ray, ion beam, and euv lithography.

BACKGROUND OF THE INVENTION

The need to remain cost and performance competitive in the production of semiconductor devices has driven the industry to a continuing increase in device density with a concomitant decrease in device geometry. To facilitate the shrinking device dimensions, new lithographic materials, processes and tools are being considered. Currently, 248 nm lithography is being pursued to print sub 200 nm features. To do this, tools with higher numerical aperture (NA) are emerging. The higher NA allows for improved resolution but reduces the depth of focus of aerial images projected onto the resist. Because of the reduced depth of focus, a thinner resist will be required. As the thickness of the resist is decreased, the resist becomes less effective as a mask for subsequent dry etch image transfer to the underlying substrate. Without significant improvement in the etch selectivity exhibited by current single layer resists, these systems can not provide the necessary lithography and etch properties for high resolution lithography.

Another problem with single layer resist systems is critical dimension (CD) control. Substrate reflections at ultraviolet (UV) and deep ultraviolet (DUV) wavelengths are notorious to produce standing wave effects and resist notching which severely limit CD control of single layer resists. Notching results from substrate topography and nonuniform substrate reflectivity which causes local variations in exposure energy on the resist. Standing waves are thin film interference (TFI) or periodic variations of light intensity through the resist thickness. These light variations are introduced because planarization of the resist presents different thickness through the underlying topography. Thin film interference plays a dominant role in CD control of single layer photoresist processes, causing large changes in the effective exposure dose due to a tiny change in optical phase. Thin film interference effects are described in "Optimization of optical properties of resist processes" (T. Brunner, SPIE Proceedings Vol. 1466, p. 297, 1991), the teaching of which is incorporated herein by reference.

Bottom anti-reflective coatings or BARCs have been used with single layer resists to reduce thin film interference. However, these thin absorbing BARCs have fundamental limitations. These materials are generally spin applied. The thickness of the BARC and the resist can not be controlled to the accuracy required to operate at the target thickness to achieve minimum reflectance. The resist thickness may also vary due to existing topography. Thin underlying films such as silicon nitride or silicon oxide tend to exhibit some thickness nonuniformity after deposition. The thin BARC will generally not effectively planarize this thin underlying films. Thus, as a result there will be a variation in exposure energy into the resist. Current trends to reduce topography via chemical/mechanical polishing still leave significant variations in film thickness over topography.

Vapor deposited such as plasma enhanced chemical vapor deposited PECVD BARCs are currently being investigated. We consider an example with a carbon ARC deposited by PECVD process. FIG. 1 represents a swing curve comparison of BARC/single layer resist process (a) and a bilayer resist process (b) in which a thin resist on the order of 2000 A is applied on top of a thick underlayer. These results are obtained by simulations on two substrates, silicon and SiO2. Swing curve reflectance at 248 nm as a function of resist thickness is computed at the resist/air interface. The simulated structure of the single layer resist (FIG. 1a solid line) includes a Si substrate, 900 A thick bottom ARC with n=1.9 and k=0.42 at 248 nm and photoresist with n=1.8 and k=0.02 at 248 nm. The optical constants of the bottom ARC are typical of PECVD ARCs. FIG. 1a shows that by using 900 A thick bottom ARC with n=1.9 and k=0.42 about 2% swing ratio can be achieved on a silicon substrate.

Similarly, a simulated bilayer structure on silicon and on a SiO2 layer is shown in FIG. 1b. This structure includes a Si substrate, a 6000 A thick underlayer with n=1.8 and k=0.2 at 248 nm and a silicon containing resist with n=1.78 and k=0.01 at 248 nm. Swing ratio of less than 4% similar to the thin ARC process was obtained for the bilayer resist structure on a Si substrate (FIG. 1b solid line). To demonstrate the dependence of the ARC on underlying topography, 500 A of SiO2 was deposited on the silicon substrate (FIG. 1, dotted lines). As can be seen in FIG. 1a, the single layer resist structure is very dependent on the underlying substrate reflectivity and topography, whereas, the bilayer structure was independent of underlying topography. A large variation in reflectance, about 18% swing ratio, which directly translates to CD variation was observed for the SLR structure with an oxide underlayer (FIG. 1a dotted line). This reflection variation directly corresponds to CD variation, and it's about 18% as a function of the resist thickness and does not meet +−10% linewidth control criterion even on single layer substrate. In contrast, almost no reflectance variation was observed for bilayer (FIG. 1b dotted line). Swing ratio of less than 4% was obtained for the simulated bilayer resist structure independently from the underlying substrate reflectivity. The entire range of the data easily fits within the +−10% linewidth control criterion. So from an optical point of view, bilayer resist structure appeared to be more beneficial compared to SLR structure.

To overcome some of the limitations of single layer resists, multilayer resist systems have been investigated such as bilayer resists. In a bilayer structure (FIG. 2), a first thick bottom polymer layer with suitable absorption at the exposing wavelength is spun on the substrate. This layer serves to planarize the underlying structure, minimize TFI and to dampen substrate reflections (notching). On top of the underlayer is applied a thin resist (on the order of 1000-4000 A). The resist generally contains Si functionality for etch resistance. The resist is exposed and developed to form a pattern in the resist. This pattern is then transferred to the underlayer by plasma etching (the si containing resist acts as hard mask for the etch process). An extensive review of thin film imaging techniques which include multilayer resists, top surface imaging (CARL) can be found in "Polymeric silicon-containing resist materials", R. D. Miller and G. M.

Wallraff, Advanced Materials for Optics and Electronics, Vol. 4, 95-127 (1994), W. Moreau, Semiconductor Lithography, 1988, Plenum, Chapter 12, pg. 591, D. Seeger, IBM J. Res. Dev. (USA) Vol. 41, N. 1-2, (1997) and S. Hien, SPIE proc. Vol. 3333 154-164 (1998) which are incorporated herein by reference.

TSI processes differ from bilayer in that a typical non silicon containing CA resist is used. After the resist is exposed, it is silylated by vapor or liquid silylation techniques. The silylated resist in turn acts as the etch resistant hard mask for transferring the pattern from the resist to the underlying substrate. A bilayer configuration utilizes a silicon containing resist; it requires no external silylation process. Both bilayer and TSI require an appropriate underlayer. A bilayer resist and TSI resist structure offers significantly higher aspect ratio than can be achieved with single layer resists. Single layer resists are on the order of 5000 A-6000 A.

A bilayer structure uses a thin resist (1000-4000 A) which can provide significant improvement in resolution and process latitude. The underlayer is on the order of 1000 A-10 um most preferably 4000 A-2.0 um, therefore once the pattern is transferred to the underlayer, high aspect ratio is attained. The thickness of a bilayer structure also offers significant advantages for etch. In single layer resists, microchannels often form through the resist after etch. When the resist is thin, the microchannels extend into the underlying films creating defects. Because of the increased thickness of the bilayer stack, any microchannels formed in the resist do not penetrate below the underlayer.

The most commonly used underlayer in a bilayer structure has been a novolac/diazonapthoquinone resist as found in "Bilayer resist approach for 193 nm lithography", Schaedely et al., Proc. SPIE—Int. Soc. Opt. Eng. (USA) Vol. 2724 1996, p 344-54. It has been believed that the lithographic performance of a bilayer resist was strictly governed by the resist. The underlayer was not believed to have a significant role in the lithographic performance.

In contrast, herein it is found that the underlayer plays a significant role in impacting the lithographic performance of the bilayer and TSI resist structure. It is found that using a typical novolac based underlayer results in an interfacial reaction with the imaging resist, resulting in significant residue and limiting the ultimate resolution.

It is therefore desirable to have a tuned underlayer material which does not interact with the resist and provides a bilayer or TSI structure with high resolution. Herein, bilayer resist and TSI resist structures are described which contain underlayers whose optical, chemical, and physical properties have been tuned to result in a high performing structure. Methods of tuning the underlayer properties are described. In addition, new materials which can be used as suitable bilayer underlayers are also described.

OBJECTS

It is an object of the present invention to provide an improved resist structure.

It is another object of the present invention to provide an improved resist formed from a plurality of layers.

It is another object of the present invention to provide a resist having a plurality of layers wherein the bottom layer is an appropriately tuned layer.

It is another object of the present invention to provide a resist having a plurality of layers wherein the bottom layer is a layer whose optical, physical and chemical properties are tuned.

It is another object of the present invention to provide a resist having a plurality of layers wherein the bottom layer substantially does not interact with the resist layer.

It is another object of the present invention to provide a resist having a plurality of layers wherein there is substantially no interfacial mixing between the underlayer and the resist.

It is another object of the present invention to provide a resist having a plurality of layers wherein the bottom layer substantially does not interact with a chemically amplified resist layer.

It is another object of the present invention to provide a resist having a plurality of layers wherein the bottom layer is appropriately cross-linked.

It is another object of the present invention to provide a resist having a plurality of layers wherein the bottom layer is a novolac that is appropriately cross-linked.

It is another object of the present invention to provide a resist having a plurality of layers wherein the bottom layer is a polyhydroxystyrene derivative that is appropriately cross-linked.

It is another object of the present invention to provide a resist having a plurality of layers wherein components from the resist substantially do not diffuse into the underlayer.

It is an object of the present invention to provide a resist having a plurality of layers wherein components from the underlayer substantially do not diffuse into the resist.

It is an object of the present invention to provide a resist having a plurality of layers wherein the optical properties, chemical properties, and physical properties of the underlayer a re controlled by an appropriately tuned thermal process.

It is an object of the present invention to provide a resist having a plurality of layers wherein the optical properties, chemical properties, and physical properties of the underlayer are controlled by appropriately exposing the underlayer to a given radiation.

It is an object of the present invention to provide a resist having a plurality of layers wherein the layers are compatible.

It is an object of the present invention to provide a resist having plurality of layers which exhibits sub 200 nm resolution.

It is another object of the present invention to provide methods of tuning the chemical, optical, and physical properties of the underlayer in a resist structure having a plurality of layers.

It is another object of the present invention to provide methods of forming a resist having a plurality of layers in which the layers are compatible.

It is another object of the present invention to provide methods of forming a resist having a plurality of layers which exhibits sub 200 m.

It is another object of the present invention to provide methods of tuning the properties of the underlayer to be used in a bilayer, trilayer or TSI process.

It is another object of the present invention to provide methods of tuning the properties of underlayer to be used in wet silylation processes such as CARL

SUMMARY OF THE INVENTION

A broad aspect of the present invention is a multilayer resist system and method of fabrication thereof.

A more specific aspect of the present invention is a multilayer resist system in which a thin resist is patterned on top of a thicker underlayer; optical, chemical, and physical properties of the underlayer are appropriately tuned to result in a multilayer resist structure exhibiting sub 200 nm resolution.

Another more specific aspect of the present invention is a multilayer resist system in which the optical, chemical, and physical properties of the underlayer are controlled to prevent interfacial mixing with the resist, interfacial reaction, and diffusion of components from one layer into another.

Another more specific aspect of the present invention are methods of tuning the optical properties such as index of refraction (n) and extinction coefficient (k) of the underlayer at a given optical wavelength including 365 nm, 248, 193, 157 nm and EUV.

Another more specific aspect of the present invention are methods of fabricating underlayers with suitable optical, chemical, and physical properties to be used as thick antireflective coating in a multilayer resist structure, said properties being tailored by controlling bake temperature, bake time, bake environment, bake type, chemical composition of underlayer, exposure to radiation including optical, x-ray, electron beam and ion beam.

Another more specific aspect of the present invention are methods of tuning the index of refraction n and extinction coefficient k from about 1.45 to about 2.1 and about 0.01 to about 0.6, respectively, at 365, 248, 193 and 157 nm.

Another more specific aspect of the present invention is a method wherein the crosslinking is dependent on the processing conditions—bake, temperature, time as well as the formulation of underlayer—i.e. the crosslinker that is put into the formulation, and the amount of crosslinker. It is a combination of designed formulation and processing conditions. If the underlayer is not appropriately designed significant residue occurs sometimes even in the larger features due to (1) interfacial mixing of resist and underlayer (2) diffusion of acid or other components of the resist into underlayer and (3) potential outgassing of components from underlayer into resist.

BRIEF DESCRIPTION OF THE DRAWINGS

FIG. 1 (b) shows swing curve of bilayer resist

FIG. 2 (a) is a bilayer resist structure.

FIG. 2 (b) is a top surface imaging (silylation reaction) scheme

FIG. 2 (c) is a diagram showing swing ratio definition

FIG. 5 (bottom) shows the corresponding n and k values as a function of wavelength FIG. 6 (top) shows the measured reflectance and the calculated reflectance and transmittance of a BARL material about 7500Å thick as described in example 2.

FIG. 6 (bottom) shows the corresponding n and k values as a function of wavelength.

FIG. 7 (top) shows the measured reflectance and the calculated reflectance and transmittance of a PHS based (4CU5) underlayer which is formulated as described in example 8.

FIG. 7 (bottom) shows the corresponding n and k values as a function of wavelength.

FIG. 8 shows cross-sectional SEM pictures of 150 nm L/S developed resist profiles on different novolak underlayers FIG. 9 shows SEM pictures of 150 nm L/S patterns of bilayer resist on novolac underlayers with different molecular weights (Mw), molecular weight distributions (Mn) and polydispersities (PDI)

FIG. 10 (a) shows SEM picture of 150 nm L/S patterns of developed silicon containing resist on tuned novolak underlayer described in present invention. FIG. 10 (b) shows SEM picture of 150 nm L/S patterns silicon containing resist on commercial i-lines SPR 501 resist used as an underlayer

FIG. 12 shows chemical structures of a copolymer of poly (4-hydroxystyrene)/anthracene methanol reacted poly(4-hydroxstyrene)(FIG. 12(a)), poly(4-hydroxystyrene (PHS) (FIG. 12(b)), the crosslinker, tetrahydro-1,3,4,6-tetrakis (methoxymethyl)-imidazo[4,5-d]imidazole-2,5-(1H,3H)-dione, powderlink, (FIG. 12(c)) and a thermal acid generator, p-nitrobenzyl tosylate (FIG. 12(d)).

DETAILED DESCRIPTION

Figure 1:
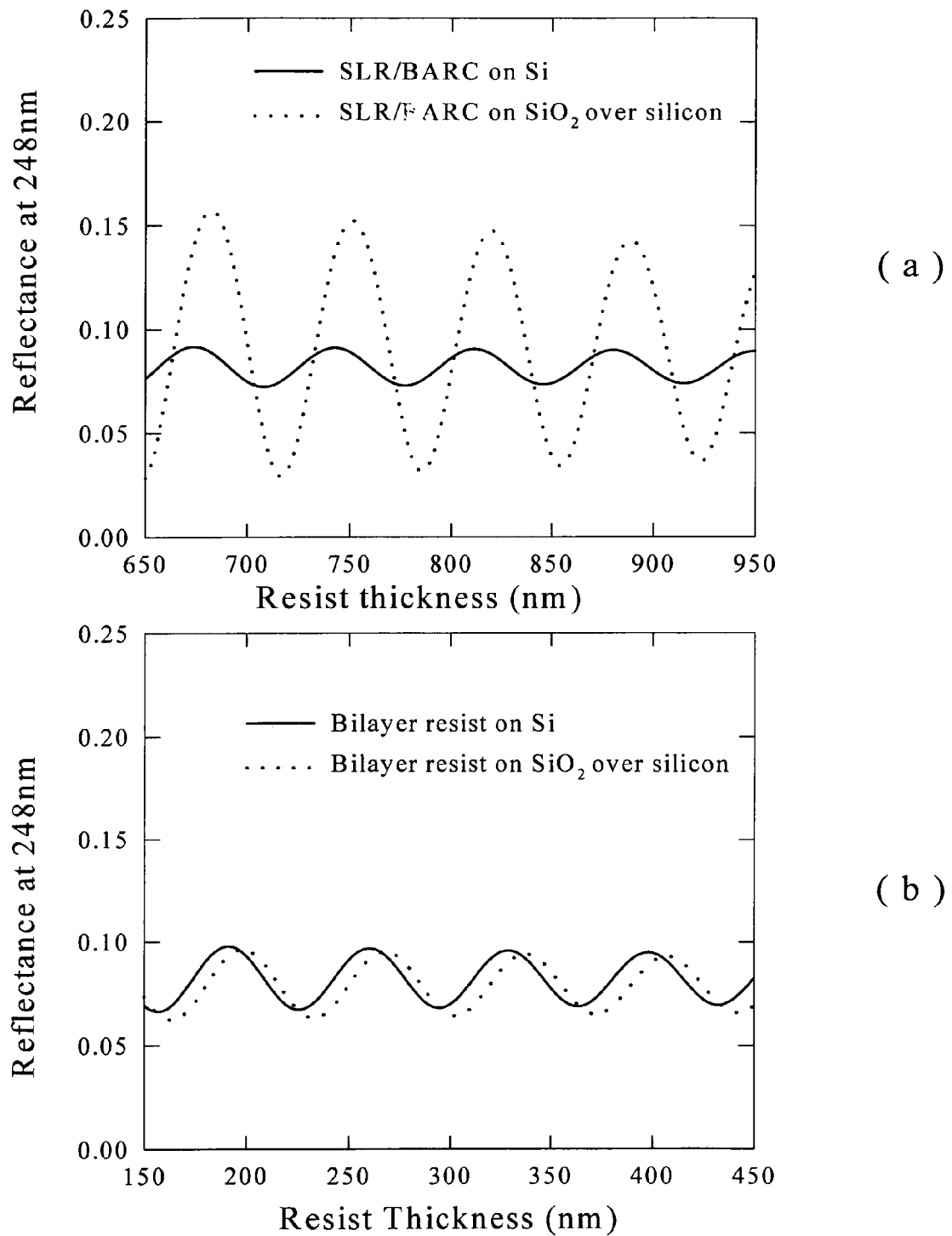
FIG. 1 (a) shows swing curve of single layer resist with bottom ARC

The present invention relates to high performance multilayer resist structures including bilayer and top surface imaging (TSI) and methods of fabrication thereof. The bilayer structure is depicted in FIG. 2a. It is produced by depositing a thin resist on the order of 1000-4000 A on a thick underlayer (on the order of 1000 A-10 um, more preferably 3000 A-0.3.0 um and most preferably 4000 A-2.0 um. The underlayer functions as a planarizing layer, an antireflective coat, and provides etch resistance for transferring the pattern into the substrate pattern. The bilayer resist contains an etch resistant functionality to act as a hard mask during the transfer of the resist process, such functionality being Si, Boron, tin, or other metal containing resist. This structure is referred to herein as a bilayer resist (FIG. 2a).

Another resist structure referred to as top surface imaging uses a conventional resist which after exposure is treated to an agent that can introduce etch resistant functionality such as silylation by vapor or liquid silylating agents. This resist structure is depicted in FIG. 2b and is referred to as top surface imaging (TSI). One specific example of TSI is CARL described in Hien et al in Proc. SPIE, vol. 3333, pt. 1-2, 1998, p 154-64; this reference is incorporated herein by reference.

Both bilayer and TSI require a carefully designed underlayer—an underlayer which does not interact with the resist and exhibits no interfacial mixing with the resist. In addition, products from the underlayer can not diffuse into the resist that can contaminate the resist and components from the resist can not diffuse into the underlayer. In addition, the underlayer must provide appropriate optical properties (n and k at a given wavelength) to function as an antireflective coating (ARC) and have appropriate etch resistance to allow the resist pattern to be transferred into the substrate silicon dioxide, silicon, and so on.

It is well known that the effective exposure dose in optical lithography varies periodically with resist thickness due to thin film interference. The swing ratio S is defined as the fractional exposure change between an interference maximum thickness and an interference minimum thickness. S is a fundamental measure of the quality of a particular resist process. By reducing the swing ratio to near zero, the resist process is able to tolerate changes in optical phase due to resist and deposited film thickness non-uniformity. The swing ratio can be calculated by the following equation:

$$S=4(R_1R_2)^{0.5}e^{-\alpha D} \quad (1)$$

$$\alpha=4\pi k/\lambda \quad (2)$$

where $R_1$ is the reflectance at the resist air interface, $R_2$ is the reflectance at the top resist/ARC interface, $\alpha$ is the resist absorption coefficient and D is the resist thickness. In this invention, we are mainly concerned in the reduction of the swing ratio by reducing $R_2$ through the use of a bilayer resist process with optimized underlayer layer ARC. A diagram explaining the significance of the above parameters is shown in FIG. 2. In general, bilayer resist systems can be modeled so a to find bottom layer optical parameters (n and k values) as well as optimum thickness. To achieve this, a knowledge of the optical constants of the entire film structure is necessary in order to compute the swing ratio reduction.

In general, underlayer thickness d varies between 1000 to 10000 A depending on film absorption. The extinction coefficient k can vary between 0.11 to 0.5. More commonly, the k values were between 0.11 and 0.3 at DUV for a 10× reduction in swing ratio. The index of refraction n vary between 1.65 to 1.95.

The most typical underlayer used in bilayer and TSI has been cross-linked novolac/diazonapthoquinone (DNQ) systems (W. Moreau, Semiconductor Lithography, 1988, Plenum, Chapter 12, pg. 591, R. D. Miller and G. M. Wallraff, Advanced Materials for Optics and Electronics, Vol. 4, 95-127 (1994)) The novolacs have many disadvantages as is described below. In particular, high temperature (>200C) is needed to cross-link, the system must be carefully designed and controlled to prevent resist/underlayer interaction, its optical properties are significantly dependent on baking conditions. Thus, to be able to use novolac systems in a bilayer, TSI process—the chemical composition and processing conditions must be controlled as described below otherwise significant interfacial interaction with the resist is observed limiting the ultimate resolution attained with the resist.

The thermal decomposition of the DNQ results in the formation of a highly reactive ketene intermediate that can form crosslinking ester functionalities with the phenolic sites of the matrix novolak. The crosslinking of this resin is essential to induce insolubilization and prevent dissolution during the solvent casting of the imaging layer. However, it was shown that underlayers formed from novolak/DNQ produced an interface interaction with the imaging layer that results in gross residual material or "scumming" after development. This artifact of the underlayer prohibits its use within this system.

In an effort to remedy this situation, we have determined that in the absence of a DNQ additive, novolak can be caused to insolubilize simply my thermal curing of a solvent-removed, spin cast film. Prolonged curing (2-5 min.) at elevated temperature (225-275° C.) is preferred. Films prepared in this manner were insoluble in common casting solvent and allowed for casting of the top imaging layer without severe mixing. The severity of the residue after development was greatly diminished as compared to the DNQ/novolak underlayer; however, some residue was persistent. Although the mechanism of this insolubilization has not been determined, it is proposed to occur due to densification of the glassy film after prolonged heating above its glass transition temperature (Tg) coupled with a complex combination of thermally induced oxidation and/or electrophilic aromatic substitution, resulting in a crosslinked network.

Evidence for these proposals lie in the dependence of the molecular weight (Mw) and polydispersity index (PDI) of the novolak polymers and the dependence of the optical properties (n & k) on the curing conditions shown in Example 5. For example, it was found that those polymers with higher Mw values resulted in underlayers that produced less scumming. This was also the case with materials of higher PDI. It is proposed that residue is largely caused by an interaction of the imaging layer with the underlayer. It is evident that the degree and/or efficiency of crosslinking of the underlayer greatly contribute to this deleterious phenomenon. The amount of residue clearly correlates inversely with both the Mw and the PDI of the novolak used in the formulation. Therefore, it is desirable to have a novolac of high MW and a broad PDI for minimization of residue. The degree of crosslinking is directly dependent on the presence of polymeric chains of greater length, i.e. higher Mw. It also appears that the presence of lower molecular weight species is important to the degree of crosslinking, as the increased ratio of functionalized hydroxymethyl "end-groups" to repeat units in these oligomers is high and leads to more crosslink sites per chain. The Mw of the novolac is in the range of 2K-50K, more preferably from 2k-25K and most preferably from 2k-15K.

Another problem with the novolac is that oxidation clearly occurs in these films as is apparent by the observed change in the optical density in the near UV and visible range. The optical absorption dramatically increases with increased curing temperature and time, consistent with the formation of highly absorbing quinoidal-type species. Thus, since the optical properties change with a minor change in processing conditions (Example 4), it is very important to tightly control the processing conditions to avoid significant variations in optical properties. The best cross-link temperatures range between 200 and 300C, more preferably from 225-275C, and most preferably from 225-260C.

A fundamental disadvantage of all the previously described underlayer systems is that the mechanism of insolubilization, i.e. crosslinking, is not well understood. A more optimum underlayer has been designed by including specific functional groups in the polymer and formulation that can contribute a particular attribute. A formulation consisting of a polymer matrix system, a thermal acid generator, and a polyfunctionalized crosslinker was developed. Each component serves its particular purpose (optical properties, insolubilization, and etch properties) on the basis of its chemical composition. In concert these material provide all the desired characteristics outlined above. Variation of the mass percentage of these component results, as well as processing conditions, result in different performance of these materials. Therefore, compositions of this type are fully tunable both on the molecular level and the formulation composition level. Additionally, process latitude has been considered in the design of the components such that a robust process can be developed without concern for performance variation with slight deviation from nominal conditions.

The polymeric system in these formulations consists of a copolymer or a terpoymer, or a blend of two or more homo- or copolymers. These polymers must be phase compatible, soluble in conventional casting solvents, and able to form high integrity, planarizing films. The copolymer or terpolymer or one or more of the blend components contains a covalently bonded "chromophore" that can be used as a means of modulating the optical properties of the material and a variety of wavelengths. For example, a poly(hydroxystyre) (PHS) based polymer that contains some portion of the aromatics rings with a substituent anthacenylmethyl or napthalene group allows for n & k modulation at 248 nm. This function group can be incorporated into the polymer structure either by direct copolymerization or by starting with a desired polymer platform (i.e. PHS) and attaching the moiety by acid catalyzed electrophilic aromatic substitution/condensation with anthracenemethanol. It has been shown that the optical properties (n and k) at 248 nm can be tuned by controlling the degree of substitution of this functional group. The optical properties of the underlayer can be further modified via the polymeric system by the inclusion of other compatible polymer of differing optical properties into the aforementioned blend. For example, unsubstituted PHS can be blended with anthacenemethylated PHS to derive a blend with the desired optical properties. These polymer, being aromatic in nature, have a high carbon to hydrogen ratio and are thus consistent with materials that targeted for use in etch resistance applications. The addition of grafted fused-polycyclic aromatic groups, such as anthracene, add to the etch resistance properties of these copolymers. These are demonstrated in Examples 8 and 9.

These polymers are rendered insoluble by an acid catalyzed reaction of an added crosslinking molecule with the polymer matrix. The thermally generated acid is provided by a thermal acid generator (TAG) species. The crosslinking species is one of a number of previously reported (Q. Lin, SPIE Proceedings Vol. 3049 974-987 (1997) polyfunctional species that can react with the phenolic sites of a polymer such as PHS or anthracenemethylated PHS. Compounds which are suitable for this application include species based on mono, di, or multi hydroxy substituted methylphenols and derivatives as described in U.S. Pat. No. 5,296,332 and amino plasts as described in U.S. Pat. No. 5,212,046, based on urea or glycoluril resins commercially available from American Cyanamid, melamines, TAGs are chosen from the class of compounds that undergo catastrophic decomposition at a given threshold temperature that results in the formation of one or more molecules of a strong acid. Examples of these may be chosen from the class of compounds designed for the similar application of photoacid generators (PAGs) or structural similar species such as p-nitrobenzyl tosylate. Particularly useful materials will decompose at a temperature that is suitable for resist underlayer processing.

Other materials that can be used as optimum underlayers include polyarylsulfones such as the BARL material (Example 7), polyhydroxystyrene based derivatives, an example being a copolymer of polyhydroxystyrene and polyhydroxystyrene reacted with anthracenemethanol that contains a cross-linker, and acid catalyst (thermal acid generator), polyimides, polyethers in particular polyarylene ethers, polyarylenesulfides, polycarbonates such as polyarylenecarbonates, epoxies, epoxyacrylates, polyarylenes such as polyphenylenes, polyarylenevinylenes such as polyphenylenevinylenes, polyvinylcarbazole, cyclicolefins, polyesters.

For the bilayer resist, the top layer resist incorporates etch resistant functionality such as silicon, boron, tin, other metal atom. Resists which are useful in practicing the current invention include si containing acrylates/methacrylates, si containing styrene derivatives, si containing norbornene type materials, silsesquioxanes, silanes, siloxanes. Structures can be found in U.S. Pat. No. 6,147,698 and U.S. Pat. Nos. 5,296,332; 5,338,818; 5,422,223; 5,286,599; 5,238,773; 5,041,358 which are incorporated herein by reference.

Top surface imaging resists are based on acrylates/methacrylates, styrene based polymers, cyclic olefins and others whose structures are found in U.S. Pat. Nos. 5,322,765; 5,250,395; 5,229,251; 5,023,164; 4,908,298; 4,810,601; 4,657,845; 4,552,833; 4,613,398 which are incorporated herein by reference.

Other resist structures, cross linkers, acid catalysts useful in practicing the present invention can be found in U.S. patents A list of resists include: UVx series (IBM/Shipley products consisting of hydroxystyrene/t-butylmethacrylate copolymers and terpolymers thereof with other polymerizable units such as styrene, methylmethacrylate, and so fourth, Methacrylate/acrylate polymers such as polymethylmethacrylate and derivatives thereof, SNR, CGR, KRS, Zep, silicon containing resists, PBS (polybutanesulfone), organometallic resists, novolak containing resists, novolak/diazoquinone resists, and so fourth.

The resist can be +tone or −tone; it can be a single layer resist or multilayer resist; chemically amplified and non chemically amplified.

The following U.S. patents describe resists useful to practice the present invention are incorporated herein by reference: U.S. Pat. Nos. 5,580,694, 5,554,485, 5,545,509, 5,492,793, 5,401,614, 5,296,332, 5,240,812, 5,071,730, 4,491,628, 5,585,220, 5,561,194, 5,547,812, 5,498,765, 5,486,267, 5,482,817, 5,464,726, 5,380,621, 5,374,500, 5,372,912, 5,342,727, 5,304,457, 5,300,402, 5,278,010, 5,272,042, 5,266,444, 5,198,153, 5,164,278, 5,102,772, 5,098,816, 5,059,512, 5,055,439, 5,047,568, 5,045,431, 5,026,624, 5,019,481, 4,940,651, 4,939,070, 4,931,379, 4,822,245, 4,800,152, 4,760,013, 4,551,418, 5,338,818, 5,322,765, 5,250,395, 4,613,398, 4,552,833, 5,457,005, 5,422,223, 5,338,818, 5,322,765, 5,312,717, 5,229,256, 5,286,599, 5,270,151, 5,250,395, 5,238,773, 5,229,256, 5,229,251, 5,215,861, 5,204,226, 5,115,095, 5,110,711, 5,059,512, 5,041,358, 5,023,164, 4,999,280, 4,981,909, 4,908,298, 4,867,838, 4,816,112, 4,810,601, 4,808,511, 4,782,008, 4,770,974, 4,693,960, 4,692,205, 4,665,006, 4,657,845, 4,613,398, 4,603,195, 4,601,913, 4,599,243, 4,552,833, 4,507,331, 4,493,855, 4,464,460, 4,430,153, 4,307,179, 4,307,178, 5,362,599, 4,397,937, 5,567,569, 5,342,727, 5,294,680, 5,273,856, 4,980,264, 4,942,108, 4,880,722, 4,853,315, 4,601,969, 4,568,631, 4,564,575, 4,552,831, 4,522,911, 4,464,458, 4,409,319, 4,377,633, 4,339,522, 4,259,430, 5,209,815, 4,211,834, 5,260,172, 5,258,264, 5,227,280, 5,024,896, 4,904,564, 4,828,964, 4,745,045, 4,692,205, 4,606,998, 4,600,683, 4,499,243, 4,567,132, 4,564,584, 4,562,091, 4,539,222, 4,493,855, 4,456,675, 4,359,522, 4,289,573, 4,284,706, 4,238,559, 4,224,361, 4,212,935, 4,204,009, 5,091,103, 5,124,927, 5,378,511, 5,366,757, 4,590,094, 4,886,727, 5,268,260, 5,391,464, 5,115,090, 5,114,826, 4,886,734, 4,568,601, 4,678,850, 4,543,319, 4,524,126, 4,497,891, 4,414,314, 4,414,059, 4,398,001, 4,389,482, 4,379,826, 4,379,833, 4,187,331.

which are described herein by reference.

The multilayer resist structures described herein can be used for 248, 193, 157, EUV, e-beam, x-ray, and ion beam lithography.

The following examples are given to illustrate the scope of the present invention. Because these examples are given for illustrative purposes only, the invention embodied therein should not be limited thereto.

EXAMPLE 1

Figure 3:
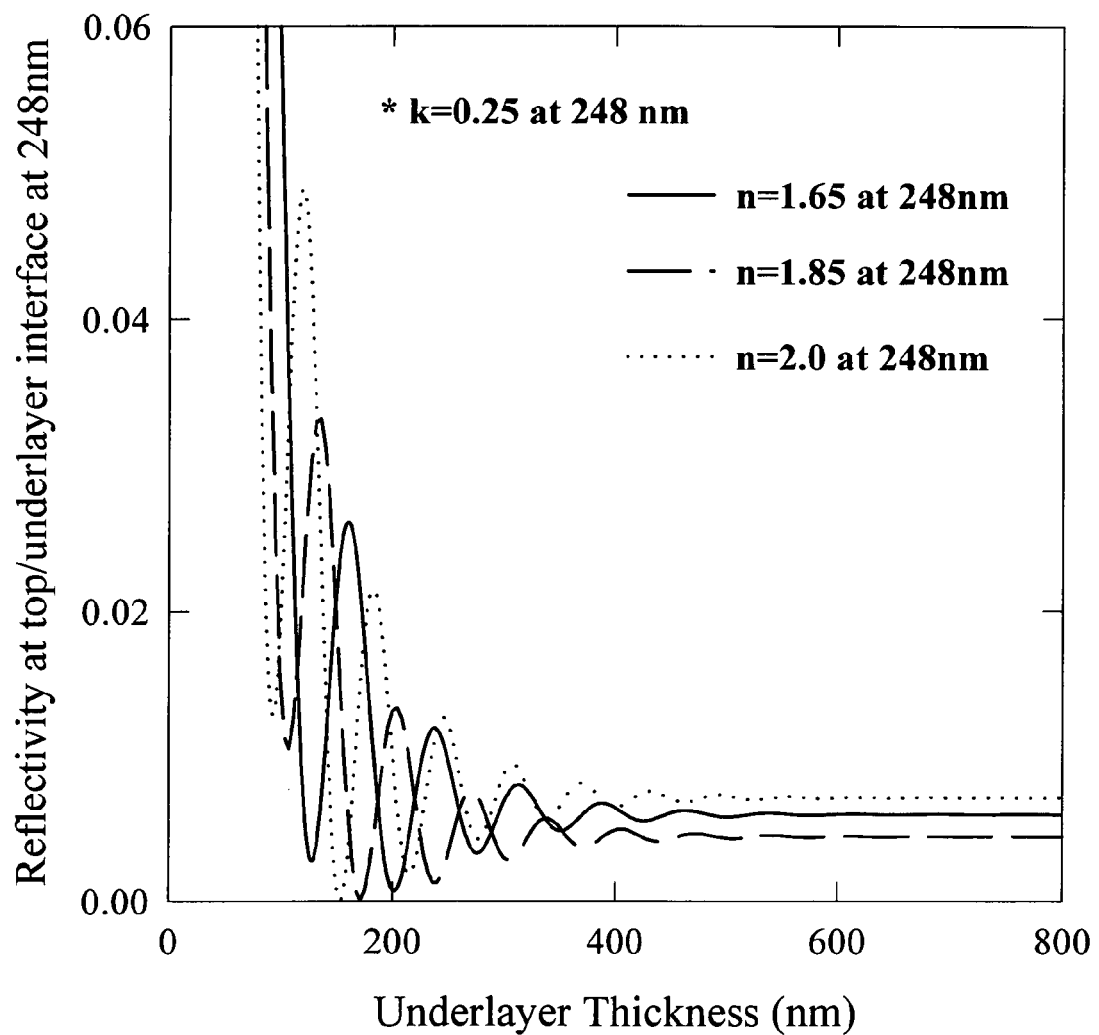
FIG. 3 shows reflectance at resist/underlayer interface at 248 nm as a function of underlayer thickness for different values of refractive index (n) using a fixed value of k=0.25
Figure 4:
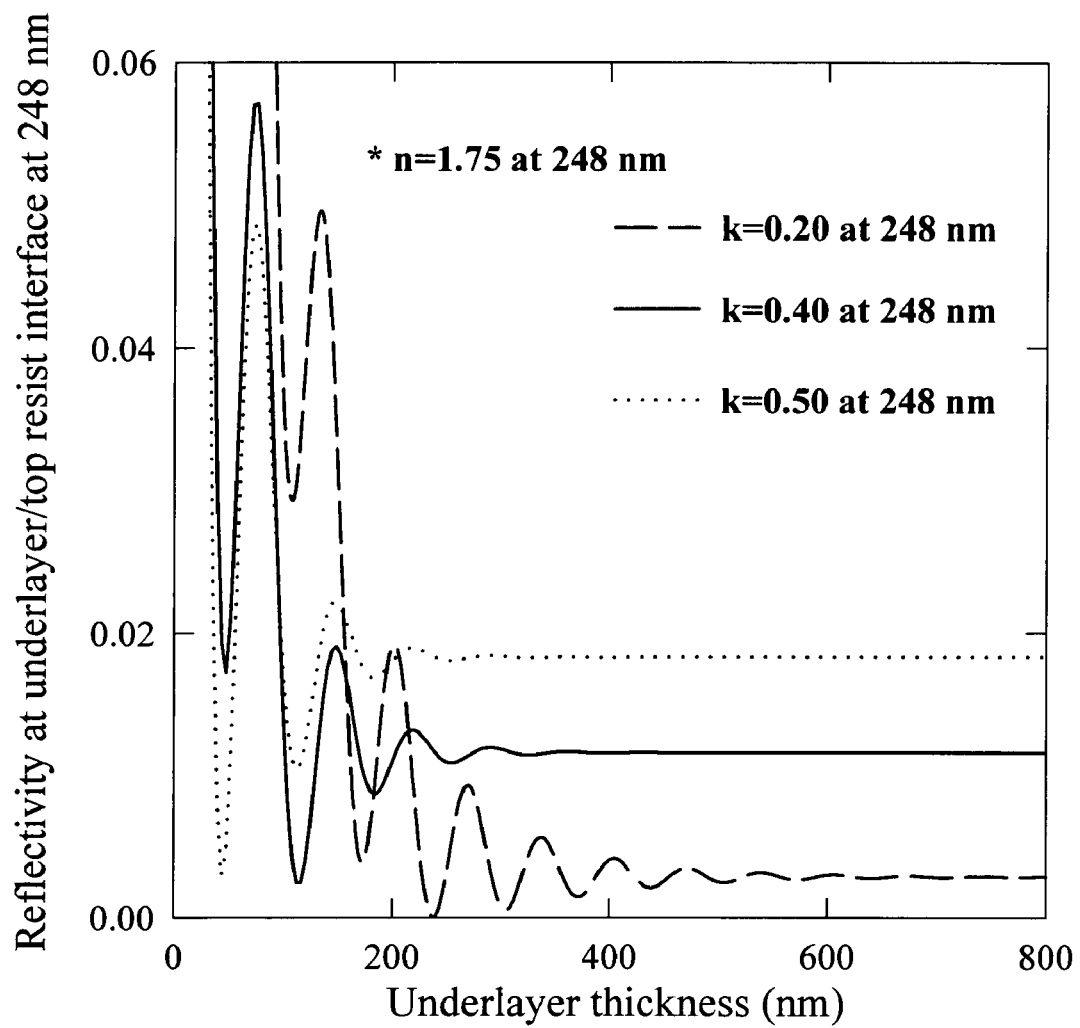
FIG. 4 shows reflectance at resist/underlayer interface at 248 nm as a function of underlayer thickness for different values of extinction coefficient (k) using a fixed value of n=1.75

The following example illustrates calculations for obtaining optimum bottom layer parameters of a bilayer system. Parameters are optimized so as to reduce reflections at the resist/underlayer interface. Computations are based on algorithms which use the Fresnel coefficients as found in standard textbooks such as Optics, by E. Hecht and A. Zajac, published in 1979 by Wiley, pages 312 and 313. These simulations can be extended to many different structures and they are not limited by the examples given below. The structure simulated in this example includes a Si substrate, underlayer and photoresist. The parameters under investigation are the bottom layer optical constants n and k and film thickness d. The imaging Si-containing resist index of refraction extinction coefficient k and film thickness are fixed and given by n=1.78, k=0.018 and d=2000 A at 248 nm. FIG. 3 shows reflectivity at the underlayer/resist interface at 248 nm as a function of underlayer thickness for different values of refractive index (n) using a fixed value of k=0.25. The structure simulated includes a Si substrate, underlayer and photoresist. These simulations show that there is no significant variation in reflectance as a function of refractive index. For instance, if 5000 A of an underlayer with 1.65<n<2.0 at 248 nm is chosen, a significant reflectivity reduction (less than 0.01) can be achieved at the resist/underlayer interface. FIG. 4 shows reflectivity at the underlayer/resist interface at 248 nm as a function of underlayer thickness, where k of the underlayer varies but n is fixed at 1.75. The simulated layered structure is similar to the one described above. In this case, by increasing the extinction coefficient higher values of reflectance are obtained for a 5000 A thick underlayer. For bilayer resist structure the extinction coefficient has a stronger impact on reflectance than does the index of refraction.

An underlayer material with k value of ~0.2 or slightly below is desirable. The optimum optical properties of the underlayer are an index of refraction in a range from 1.65 to 2.0 and an extinction coefficient from about 0.18 to about 0.22 at 248 nm. Thus, by using an underlayer 5000 A or thicker, the reflectance becomes insensitive to the underlying topography.

EXAMPLE 2

The following example illustrates how to measure the optical constants n and k of the underlayer materials. This measurement technique can be applied to a variety of different processes and it is not limited by the two example above.

The optical constants were measured using an n&k Analyzer manufactured by n&k Technology, S. Clara, Calif. A description of this instrument and its operation can be found in U.S. Pat. No. 4,905,170, 1990. They use a method based on broadband spectrophotometry and equations for optical constants derived by Forouhi and Bloomer (Phys. Rev. B, 38, pp. 1865-1874, 1988). Their analysis is based on a physical model for the refractive index, n, and extinction coefficient, k, applicable to a wide range of semiconductor and dielectric films, and valid over the deep ultraviolet—near infrared wavelength range. The n($\lambda$) and k($\lambda$) ($\lambda$ is the wavelength) spectra of any material cannot be measured directly but they are determined from a de-convolution of a reflectance measurements R($\lambda$). This measurable quantity depends on film thickness, optical constants of the films and substrate. The "n&k Method" provides an accurate, rapid, and non-destructive way to uncouple a reflectance measurement. Algorithms can be generated that compare the theoretical reflectance with the measured one. From this comparison film thickness, n($\lambda$) and k($\lambda$) spectra can be determined.

Figure 5:
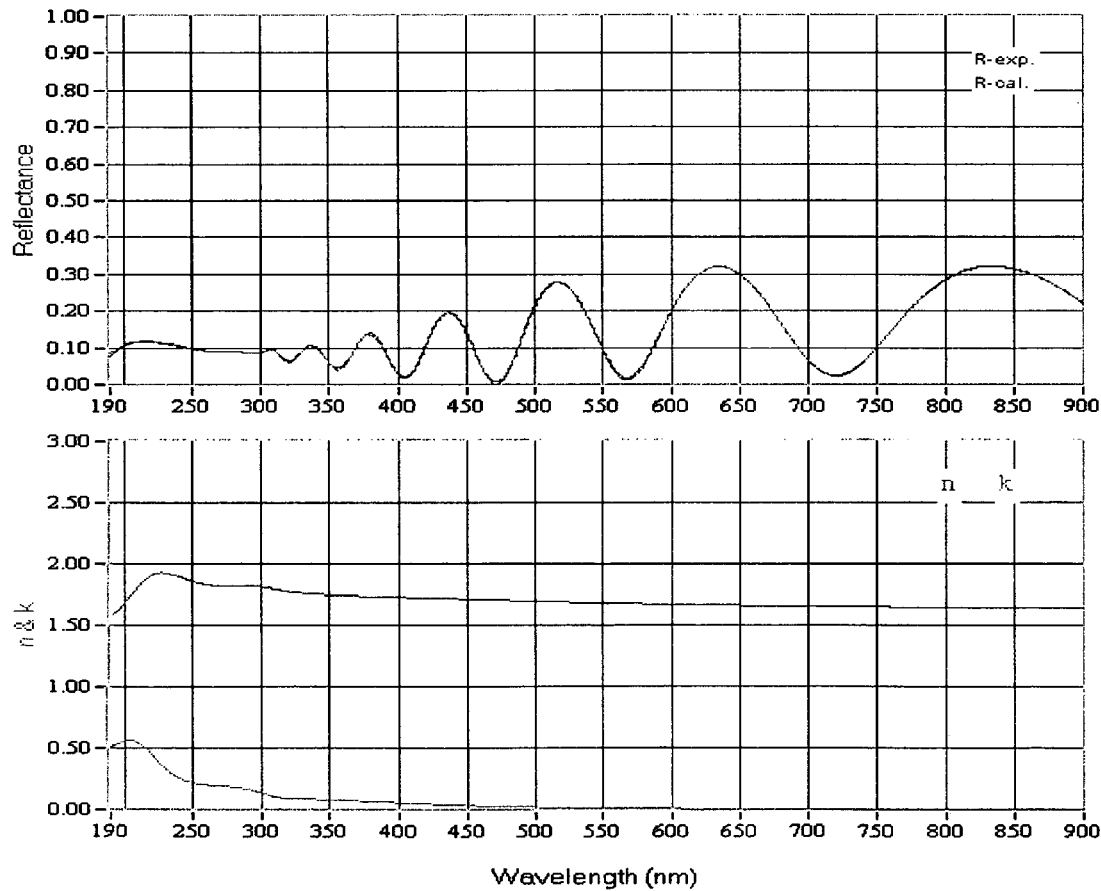
FIG. 5 (top) shows the measured reflectance and the calculated reflectance of a novolak material about 9000Å thick as described in example 2.

FIG. 5 (top) show the reflectance spectra (from 900 to 190 nm) measured by the n&k Analyzer of novolak underlayer by the method of example 6. The corresponding n and k values are plotted in FIG. 5 (bottom). FIG. 6 (top) show the reflectance spectra (from 900 to 190 nm) measured by the n&k Analyzer of BARL underlayer by the method of example 7. FIG. 7 (top) show the reflectance spectra (from 900 to 190 nm) measured by the n&k Analyzer of PHS based underlayer (4CU5) by the method of examples 8 and 9. The films analyzed are about from 7000 and to about 8000 A thick.

For these particular examples n varies from ~1.84 to ~1.85 and k from ~0.15 to ~0.22 at 248 nm which is compatible with the reflectance analysis of example 1.

EXAMPLE 3

The following example is given to demonstrate the tuning of optical properties of novolac/diazonapthoquinone underlayers. The optical properties of the coated novolac/diazonapthoquinone materials that described in this example are: 1) the index of refraction (n) at 248 nm, 2) the extinction coefficient (k) at 248 nm and 3) the absorption coefficient ($\alpha$) 248 nm was calculated from equation (1) above. Shipley grade 2 novolak had been spun coated onto 8" wafers then soft baked at 120C for 30 seconds and hard baked at four different temperatures: 225, 250, 252, 275 and 300 degrees C. for 90 seconds using contact hotplates. Optical properties of novolac films measured by method described in example 2 and summarized in Table 1. We have found a strong correlation between the optical properties of novolak underlayers and processing conditions. Novolac underlayers found hard to control due to high dependance of n and k values on process temperature.

EXAMPLE 4

Figure 14:
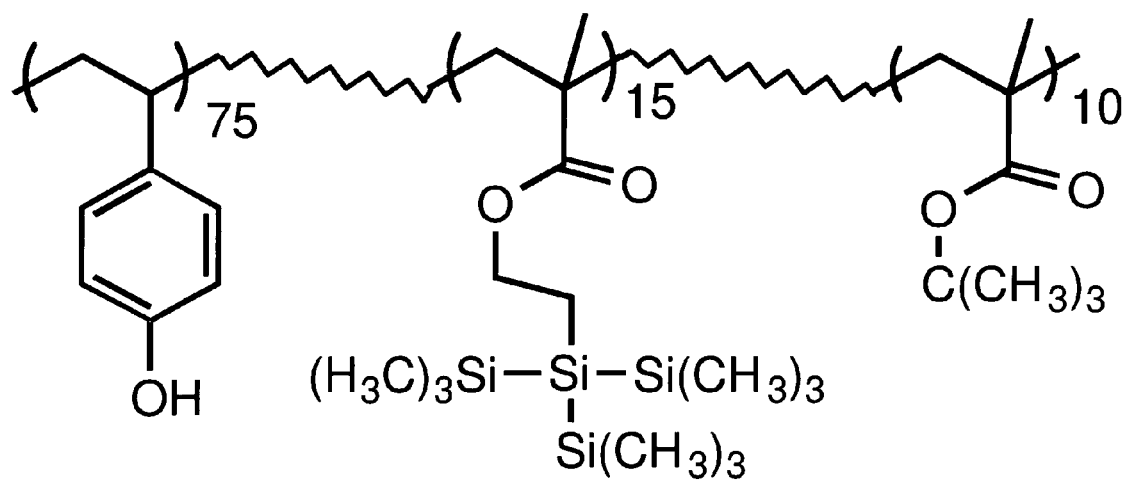
FIG. 14 shows chemical structures of RS4 imaging silicon containing resist

The following example is given to demonstrate the effect of n and k values of novolak underlayer on standing waves in imaging resist. Shipley grade 2 novolak had been spun coated onto 8" wafers then soft baked at 120C for 30 seconds and hard baked at four different temperatures: 225, 252, and 300 degrees C. for 90 seconds using contact hotplates. A thin silicon containing resist (FIG. 14) is spun on a top of novolac underlayer and baked at 120C for 60 sec. Imaging silicon containing resist used in this example previously described in IBM patent docket # AM997002 and 997023 and incorporated here as a reference. Then, resist is exposed to a 248 nm rediation at a dose of about 38 mJ/cm2 using ASML micostepper and post-exposed baked at 120C for 60 second. Then resist is developed in LDD26W Shipley developer. SEM cross-section pictures of 150 nm L/S developed resist shown in FIG. 8. FIG. 8 (*a*) shows resist profiles obtained using of novolak underlayer described in present invention and shown no "standing waves" which will result in good CD controll of 150 nm devices. In comparison, FIGS. 8 (*b*) and (*c*) shows pictures of resist profiles fabricated using conventional novolak materials as un underlayer. Clearly, standing waves can be seen on resist profiles when conventional novolak underlayers are used. The best cross-link temperatures range between 200 and 300C, more preferably from 225-275C, and most preferably from 225-260C.

EXAMPLE 5

The following example is given to demonstrate the effects of novolak resin polydispersity on the degree of residue at the underlayer interface. Molecular weights (Mw), molecular weight distributions (Mn) and polydispersities (PDI) of novolak resins that described in this example summarized in Table 3. Novolak resin of various molecular weights (Mw), molecular weight distributions (Mn) and polydispersities (PDI) I, II, and III were dissolved in PGMEA (15 wt. %), and spin cast onto 8" Si wafers. The wafers were post—application baked at 120° C. for 60 s and subsequently cured at 252° C. for 90 seconds using a contact hotplate. The silicon containing imaging resist described in example 4 was applied and processed as in the example above. SEM analysis demonstrated significantly lower degree of residue when the high polydispersity novolak (I) was employed (FIG. 9 (a)) versus either of the other novolak samples (II and III) of lower polydispersity, as shown in FIG. 9(b) and (c).

EXAMPLE 6

The following example is given to demonstrate how to tune the processing conditions of novolak underlayer materials to achieve device fatures of 150 nm and below Conventional novolak materials which properties have not been tunes properly, incorporated herein by reference, can not be used as an underlayer materials for multilayer resists to form device features of 150 nm and below.

Specially tuned as described in examples 1-4 Shipley grade 2 novolak resin had been spun coated onto 8" wafers then soft baked at 120C for 30 seconds and hard baked at 252C for 90 seconds using contact hotplates. A thin silicon containing resist described in example 4 is spun on a top of novolac underlayer and baked at 120C for 60 sec. Then resist is exposed to a 248 nm radiation at a dose of about 38 mJ/cm2 using ASML micostepper and post-exposed baked at 120C for 60 second. Then resist is developed in LDDZ6W Shipley developer. SEM pictures of 150 nm L/S patterns of developed silicon containing resist shown in FIG. 10(a). Boundary between imaging silicon resist and novolak underlayer is clearly visible. Note that there is a limited amount of residue "grass" present at silicon resist underlayer interface due to interfacial mixing during the processing. But residue is not significant and does not effect the imaging resist resolution (FIG. 10(a)). FIG. 10(b) shows resist profiles on non tuned conventional Shipley novolac/diazonapthoquinone resist SPR 501 used as an underlayer Although novolac/diazonapthoquinone resist SPR 501 was hard baked to suitably cross-linked the material to prevent interfacial mixing with the resist, significant residue was observed. Resolution of 150 nm and below can not be attained with conventional novolac/diazonapthoquinone resists.

EXAMPLE 7

Figure 11:
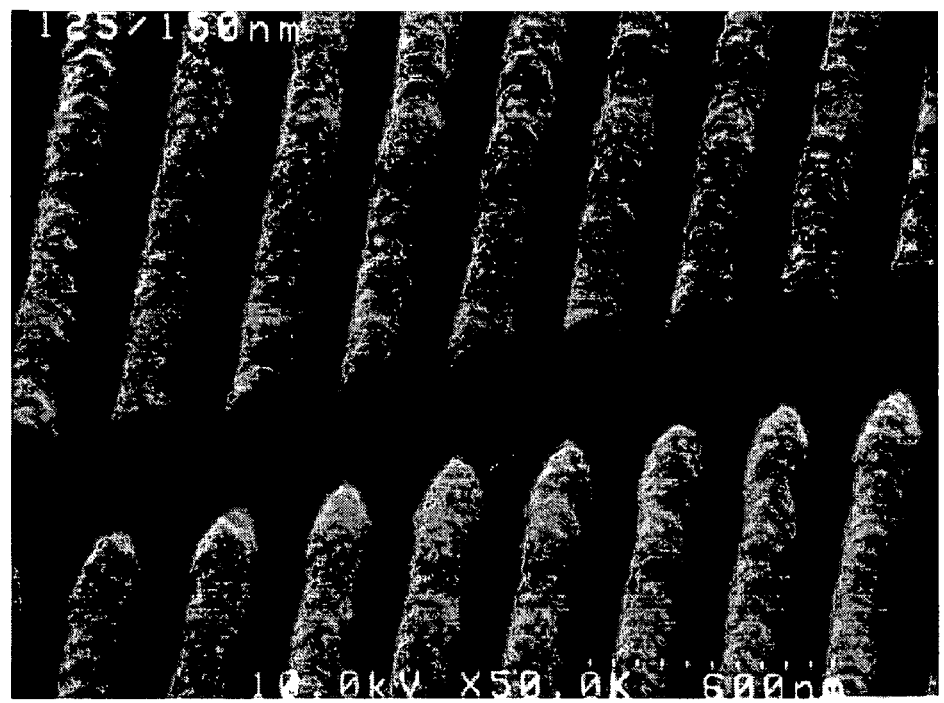
FIG. 11 shows SEM picture of 125/150 nm L/S patterns of silicon containing resist on BARL underlayer.

The following example is given to demonstrate the use of BARL as an underlayer material for multilayer resist system. BARL had been spun coated onto 8" wafers then baked at 225C for 4 minutes using contact hotplates. A thin silicon containing resist described in example 4 is spun on a top of novolac underlayer and baked at 120C for 60 sec. Then resist is exposed to a 248 nm rediation at a dose of about 38 mJ/cm2 using ASML micostepper and post-exposed baked at 120C for 60 second. Then resist is developed in LDD26W Shipley developer. FIG. 11 shows SEM picture of 125/150 nm L/S patterns of silicon containing resist on BARL underlayer.

EXAMPLE 8

The following example is given to demonstrate how a poly(hydroxystyrene) based underlayer is formulated. A four component poly(hydroxystyrene) based system is a blend of two polymers (poly(4-hydroxystyrene) and 9-anthracenyl-methylated PHS), a crosslinking agent (powderlink), and a thermal acid generator (p-nitrobenzyl tosylate). FIG. 12 shows chemical structures of poly(4-hydroxystyrene) (FIG. 12(a)), 9-anthracenylmethylated PHS (FIG. 12(b)), and tetrahydro-1,3,4,6-tetrakis (methoxymethyl)-imidazo[4,5-d] imidazole-2,5-(1H,3H)-dione "Powderlink" (FIG. 12(c)) and p-nitrobenzyl tosylate (FIG. 12(d)). The ratio of two polymers poly(4-hydroxystyrene) and 9-anthracenylmethylated PHS was 31:69. This ratio may be adjusted between the ranges of 0:100 to 100:0 to deliver the desired optical properties. To this mixture, 10 wt-% (based on the total polymer weight) of the crosslinking agent-powderlink and 5 wt-% (based on the total polymer weight) of the thermal acid generator, p-nitrobenzyl tosylate were added. The charges of these components may be adjusted to alter the performance of the underlayer.

EXAMPLE 9

Figure 13:
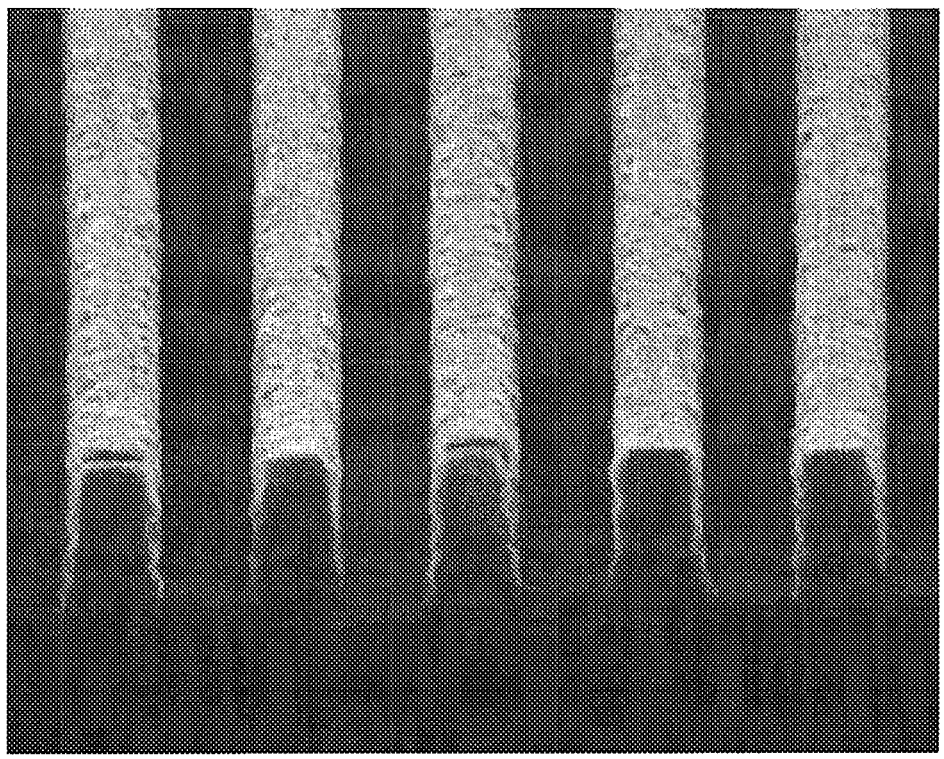
FIG. 13 shows SEM picture of 150 nm L/S patterns of silicon containing resist on PHS based underlayer.

The following example is given to demonstrate the performance of silicon containing resist on polyhydroxy styrene based underlayer which was formulator as described in the example 8. Polyhydroxy styrene based underlayer had been spun coated onto 8" wafers then soft baked at 120C for 30 seconds and then hard baked at 170C for 90 seconds using contact hotplates. A thin silicon containing resist described in example 4 was spun on a top of the underlayer and baked at 120C for 60 sec. Then resist is exposed to a 248 nm rediation at a dose of about 38 mJ/cm2 using ASML micostepper and post-exposed baked at 120C for 60 second. Then resist is developed in LDD26W Shipley developer. FIG. 13 shows SEM picture of 150 nm L/S patterns of silicon containing resist on polyhydroxy styrene based underlayer and shows no residue at the imaging resist/underlayer interface.

TABLE 1

| Soft Bake | Hard Bake | $n_{248\,nm}$ | $k_{248\,nm}$ | $\alpha\,(\mu m^{-1})$ |
|---|---|---|---|---|
| 120 C./30 sec | 225 C./120 sec | 1.920 | 0.090 | 4.56 |
| 120 C./30 sec | 250 C./120 sec | 1.870 | 0.170 | 8.61 |
| 120 C./30 sec | 252 C./120 sec | 1.860 | 0.204 | 10.33 |
| 120 C./30 sec | 275 C./120 sec | 1.820 | 0.280 | 14.18 |
| 120 C./30 sec | 300 C./120 sec | 1.740 | 0.380 | 19.25 |

TABLE 2

| Soft Bake | Hard Bake | $n_{248\,nm}$ | $k_{248\,nm}$ | $\alpha\,(\mu m^{-1})$ |
|---|---|---|---|---|
| 120 C./30 sec | none | 1.773 | 0.170 | 8.61 |
| 120 C./30 sec | 155 C./120 sec | 1.782 | 0.177 | 8.96 |
| 120 C./30 sec | 170 C./120 sec | 1.779 | 0.173 | 8.76 |

TABLE 2-continued

| Soft Bake | Hard Bake | $n_{248\,nm}$ | $k_{248\,nm}$ | $\alpha\ (\mu m^{-1})$ |
|---|---|---|---|---|
| 120 C./30 sec | 230 C./120 sec | 1.774 | 0.184 | 9.32 |
| 120 C./30 sec | 250 C./120 sec | 1.790 | 0.167 | 8.46 |

TABLE 3

| Novolak | M(w) | M(n) | PDI |
|---|---|---|---|
| I | 12,100 | 1,700 | 7.1 |
| II | 7,900 | 1,600 | 4.9 |
| III | 43,200 | 12,800 | 3.4 |

While the invention has been particularly shown and described with respect to preferred embodiment thereof, it will be understood by those skilled in the art that the foregoing and other changes in form an details may be made therein without departing from the spirit and scope of the invention.

Having thus described our invention, what we claim as new and desire to secure by Letters Patent is:

1. A method comprising:
   disposing on a surface, a layer of polymeric resin material, said layer of polymeric resin material having a thickness of between about 1000 Å and 10000 Å and comprising an optically tuned planarizing layer, said tuned layer having an index of refraction layer (n) from about 1.4 to about 2.1, and an extinction coefficient (k) from about 0.1 to 0.6 at 365, 248 193 and 157 nm,
   said polymeric resin being selected from the group consisting of novolac/diazonapthoquinone resin, polysulfones, polyhydroxystyrene based materials, polyimide materials cast from solvents substantially free of amines, and blends thereof, said resin containing a covalently bonded chromophore used to modulate the optical properties of said material and a variety of wavelengths;
   a polyfunctionalized crosslinking agent selected from the group consisting of mono-, di-, multi hydroxy substituted methylphenols, aminoplasts, urea resins, glycoluril resins, melamines; and
   a thermal acid generator comprising compounds that undergo catastrophic decomposition at a given threshold temperature that results in the formation of one or more molecules of a strong acid;
   disposing on said layer of polymeric resin material, a layer of resist material containing photosensitive elements;
   said layer of polymeric resin material having a crosslink density sufficiently high that said polymeric resin material and said resist material do not substantially intermix;
   said layer of polymeric resin material being thicker than said layer of resist material, and forming a multilayer resist structure exhibiting sub 200 nm resolution,
   said multilayer resist comprising a first layer having a thickness of between about 1000A and 4000A on a second layer having a thickness between about 1000 A and 3.0 µm.

2. A method according to claim 1, wherein said layer of material is novolac.

3. A method according to claim 1, wherein said resist is exposed to energy to form a pattern in said resist.

4. A method according to claim 3, wherein said energy is a beam selected from the group consisting of electromagnetic radiation and a particle beam.

5. A method according to claim 1 wherein said crosslink density is dependent upon the processing conditions comprising temperature, time, the formulations of said layer of material, the crosslinker that is put into the formulation and the amount of crosslinker.

6. A method according to claim 1 wherein said crosslinking agent is a glycouril resin, said thermal acid generator is p-nitrobenzyl tosylate and said polymeric resin is a copolymer of polyhydroxystyrene and polyhydroxystyrene reacted with an anthracenemethanol.

* * * * *